United States Patent
Takahashi et al.

(10) Patent No.: US 12,219,744 B2
(45) Date of Patent: Feb. 4, 2025

(54) ELECTRONIC CONTROL DEVICE

(71) Applicant: Hitachi Astemo, Ltd., Hitachinaka (JP)

(72) Inventors: Yusuke Takahashi, Hitachinaka (JP); Yoshio Kawai, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 204 days.

(21) Appl. No.: 18/015,644

(22) PCT Filed: May 31, 2021

(86) PCT No.: PCT/JP2021/020684
§ 371 (c)(1),
(2) Date: Jan. 11, 2023

(87) PCT Pub. No.: WO2022/059263
PCT Pub. Date: Mar. 24, 2022

(65) Prior Publication Data
US 2023/0255009 A1   Aug. 10, 2023

(30) Foreign Application Priority Data
Sep. 18, 2020 (JP) ................ 2020-157833

(51) Int. Cl.
*H05K 5/00* (2006.01)
*H05K 9/00* (2006.01)

(52) U.S. Cl.
CPC ......... *H05K 9/0039* (2013.01); *H05K 5/0069* (2013.01); *H05K 9/0026* (2013.01)

(58) Field of Classification Search
CPC ... H05K 9/0039; H05K 5/0069; H05K 9/0026
See application file for complete search history.

(56) References Cited

U.S. PATENT DOCUMENTS

| 5,418,685 A | 5/1995 | Hussmann et al. |
| 6,269,008 B1 * | 7/2001 | Hsu ................ H05K 9/0032 |
| | | 361/818 |

(Continued)

FOREIGN PATENT DOCUMENTS

| JP | 6-507049 A | 8/1994 |
| JP | 2001-251087 A | 9/2001 |

(Continued)

OTHER PUBLICATIONS

International Search Report (PCT/ISA/210) issued in PCT Application No. PCT/JP2021/020684 dated Aug. 17, 2021 with English translation (five (5) pages).

(Continued)

*Primary Examiner* — Sherman Ng
(74) *Attorney, Agent, or Firm* — Crowell & Moring LLP

(57) ABSTRACT

In order to prevent a short-circuit failure between a conductive connecting portion (1) that is provided as a countermeasure against external electrical noises and an electronic circuit, a structure is adopted where a large number of electronic components (8) are mounted on a circuit board (5) that is mounted on a base (7), a metal cover (6) is disposed so as to cover upper portions of the electronic components (8), opening portions (3) are formed in the circuit board (5) at four positions on a periphery of the circuit board (5), protruding members (12) that are integrally formed with the base (7) are disposed at four positions respectively in alignment with the positions where the opening portions (3) are formed, the protruding members (12) are made to pass through the opening portions (3) at four positions from a back surface side of the circuit board (5) to protrude to a front surface side of the circuit board 5, the conductive connecting portions (1) are arranged in an outside direction with respect to the protruding members (12) at four positions on the board, the protruding members (12) are disposed (Continued)

between the conductive connecting portions (1) and the electronic circuit so as to electrically connect the metal cover (6), the conductive connecting portion (1), and a ground circuit to each other.

13 Claims, 14 Drawing Sheets

(56) References Cited

U.S. PATENT DOCUMENTS

| | | | | |
|---|---|---|---|---|
| 2006/0171127 A1* | 8/2006 | Kadoya | ............... | H01L 25/165 |
| | | | | 361/752 |
| 2014/0071635 A1* | 3/2014 | Werner | ............... | H05K 9/0052 |
| | | | | 361/748 |
| 2014/0085839 A1* | 3/2014 | Nakano | ............... | H05K 5/061 |
| | | | | 361/752 |
| 2015/0331058 A1* | 11/2015 | Kamata | ............... | G01R 31/371 |
| | | | | 324/434 |
| 2016/0113137 A1* | 4/2016 | Nuriya | ............... | H05K 7/20445 |
| | | | | 361/728 |
| 2018/0295262 A1* | 10/2018 | Dellock | ............... | G03B 17/02 |
| 2019/0380226 A1* | 12/2019 | Kojima | ............... | H05K 7/2049 |

FOREIGN PATENT DOCUMENTS

| | | |
|---|---|---|
| JP | 2015-220153 A | 12/2015 |
| JP | 2019-16664 A | 1/2019 |
| JP | 2019-133858 A | 8/2019 |

OTHER PUBLICATIONS

Japanese-language Written Opinion (PCT/ISA/237) issued in PCT Application No. PCT/JP2021/020684 dated Aug. 17, 2021 (four (4) pages).

International Preliminary Report on Patentability (PCT/IB/338 & PCT/IB/373) issued in PCT Application No. PCT/JP2021/020684 dated Mar. 30, 2023, including English translation of document C2 (Japanese-language Written Opinion (PCT/ISA/237), filed on Jan. 11, 2023) (6 pages).

* cited by examiner

ELECTRONIC CONTROL DEVICE

TECHNICAL FIELD

The present invention relates to an electronic control device.

BACKGROUND ART

In recent years, with respect to an in-vehicle electronic control device, for the purpose of reducing a weight of an entire vehicle, there has been proposed an electronic control device that adopts a direct fixing structure where a connecting cable wired between a body of the in-vehicle control device and a sensor or an actuator is shortened. The direct fixing structure of the in-vehicle electronic control device is a structure that enables direct fixing to the engine body, direct fixing to the transmission, and the like. Further, regarding materials of parts that form the electronic control device, a change in material of a board (base) from metal to a resin has been in progress in order to reduce a weight of the device. This is because the weight of the entire device can be reduced by replacing a metal having a high specific gravity, which has been often used heretofore, with a light resin.

For example, FIG. 12 illustrates an example where a set of in-vehicle control devices for a transmission including an electronic control device adopts a direct fixing structure. In FIG. 12, a transmission 130 includes a mechanism unit (not illustrated) that changes a rotational driving force of an engine or the like and transmits the rotational driving force, and a transmission case 131 that accommodates the mechanism unit. An electronic control device 100 that includes a resin-made base is mounted on the transmission case 131. A transmission connector 132 attached to the electronic control device 100 and the transmission case 131 are electrically connected to each other by a short connecting cable 133.

As described above, the formation of a portion of the material of the in-vehicle control device using a resin means that a component having a large area that surrounds a circuit board becomes non-conductive. As a result, an electromagnetic shielding effect that a conventional metal component possesses is lost.

Therefore, how to prevent an external electromagnetic interference from affecting a circuit board mounted on an in-vehicle electronic control device has arisen as a new problem.

CITATION LIST

Patent Literature

PTL 1: JP 2019-133858 A

SUMMARY OF INVENTION

Technical Problem

The printed circuit board of the electronic control device described in Patent Literature 1 is mounted on the non-conductive case, and a metal-made cover that covers the printed circuit board is further disposed. In order to obtain an electromagnetic shielding effect, a structure is illustrated where a protruding structure that protrudes from the metal cover toward the printed circuit board is provided to bring the metal cover close to the printed circuit board, and a predetermined gap is held between the printed circuit board and the protruding structure. With such a structure, in a case where a surge current is generated in a housing or the metal cover when the electronic control device is being used, an electric discharge occurs in the gap so that the surge current is released to a ground and hence, it is possible to protect the important circuit board on which the electronic circuit is mounted.

However, in the method of holding a predetermined gap between the protruding structure of the metal cover and the circuit board, there exists a problem that the impedance is increased at the time of electric discharging thus giving rise to a problem that a noise resistance performance is deteriorated. In view of the above, in order to improve the noise-resistant performance, a structure is considered where a conductive material is disposed between the metal cover and the circuit board so as to ensure sufficient grounding.

However, in many cases, a conductive material often contains an adhesive curable resin material, and often exhibits fluidity and becomes amorphous in an uncured stage. Therefore, even when the conductive material is made to adhere to the circuit board at a predetermined position at the time of assembling the electronic control device, since the conductive material is not a solid material, there is a possibility that the conductive material spreads even slightly around an area where the conductive material is made to adhere to the circuit board until the curing of the curable resin material is completed.

In this case, there is a concern that the conductive material is physically brought into contact with an electronic component or a wiring pattern around the area where the conductive material is made to adhere to the circuit board so that an electric short-circuit failure is induced. In order to avoid such a concern, it is necessary to set a larger component mounting prohibiting region on the circuit board than the prior art.

Accordingly, it is an object of the present invention to suppress unnecessary spreading of a conductive adhesive on a circuit board so that it is possible to prevent a short-circuit failure between a conductive connecting portion and an electronic component or a wiring pattern even when a component mounting prohibiting region having a small area is formed.

Solution to Problem

In order to achieve the above object, the present invention provides an electronic control device that includes: a base made of a resin; a circuit board on which an electronic component is mounted; a metal cover that covers the electronic component; and a conductive connecting portion that provides an electric conductive connection between the metal cover and a ground circuit of the circuit board, wherein the circuit board is sandwiched between the base and the metal cover, a protruding member is disposed between the conductive connecting portion and the electronic component, and the conductive connecting portion and the protruding member are brought into contact with each other.

Advantageous Effects of Invention

According to the present invention, at the time of arranging a conductive material on the circuit board at a predetermined position, it is possible to prevent undesired spreading of the conductive material on a board surface of the circuit board. Therefore, even in a case where a component mounting prohibiting region on the circuit board is set small, it is possible to prevent the conductive material from being brought into contact with the electronic component or a wiring pattern on the circuit board and hence, it is possible to prevent breaking of the circuit.

DESCRIPTION OF EMBODIMENTS

Figure 1A:
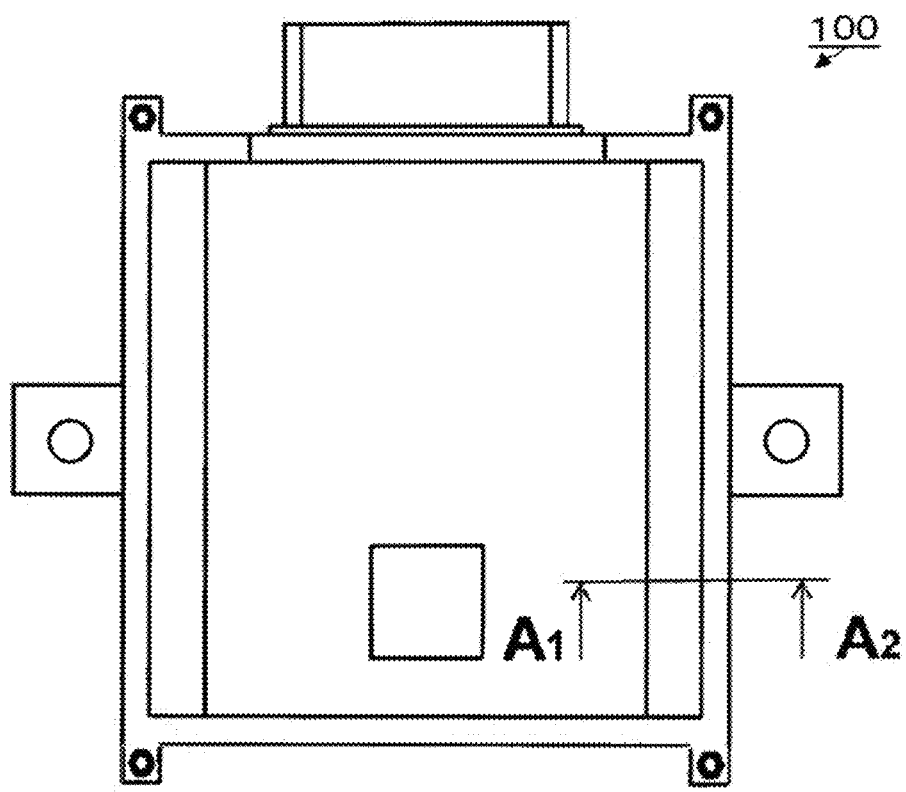
FIG. 1A is an external plan view of an electronic control device according to a first embodiment.

Hereinafter, an electronic control device according to the present invention will be described in detail by way of embodiments with reference to the accompanying drawings. The electronic control device controls, for example, an actuator (electromagnetic valve or the like) used for an engine, a transmission or the like. In the respective drawings, the same reference numerals denote the same portions. In addition, the drawings are schematically or conceptually illustrated, and sizes of the components, a ratio of relative sizes, and the like are not necessarily the same as those of an actual device. There may be a case where the portions are illustrated in the drawings in such a manner that the sizes of the portions are intentionally changed.

Figure 13:
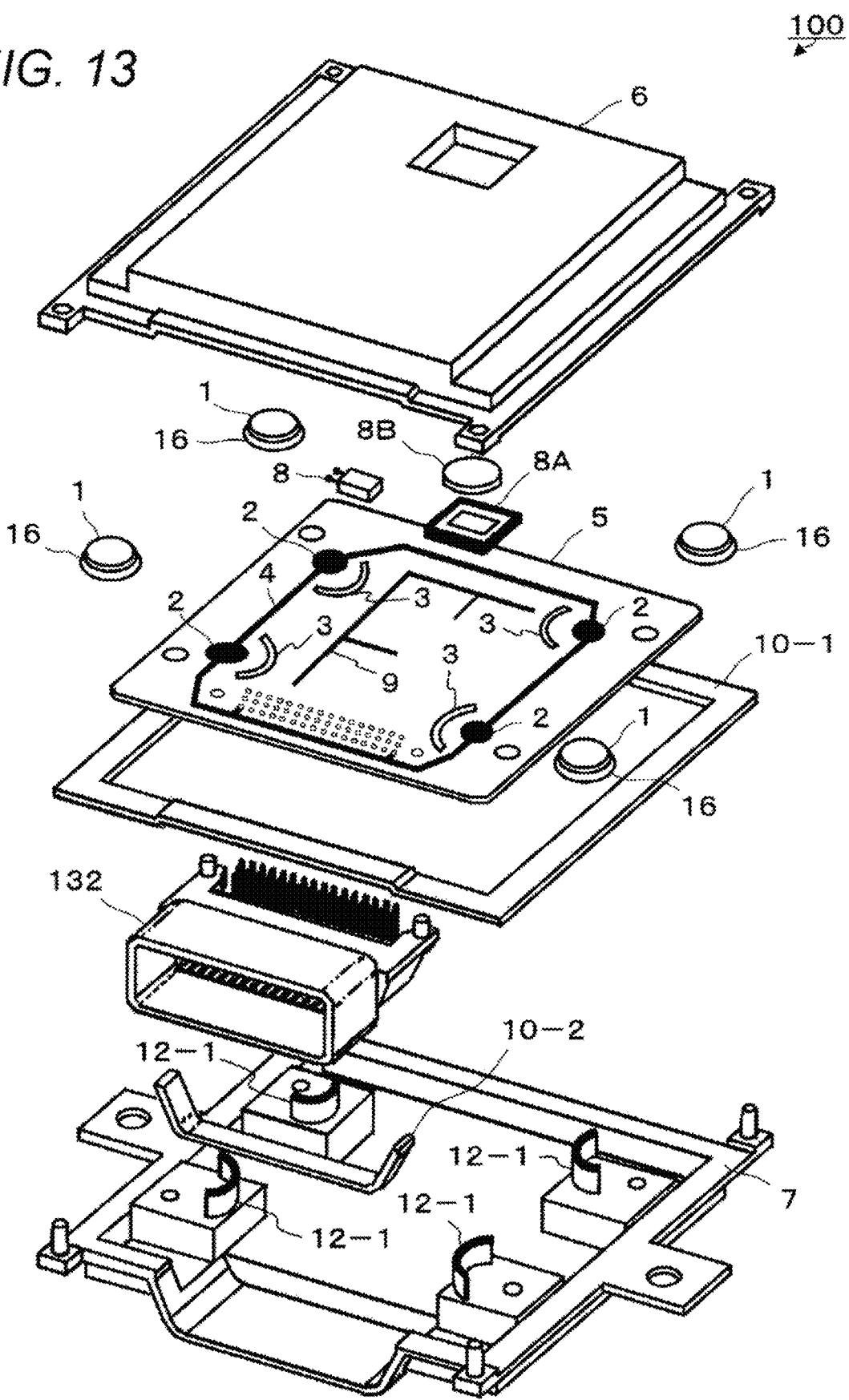
FIG. 13 is an exploded perspective view of the electronic control device of the present invention.

First, FIG. 13 is an exploded perspective view of the electronic control device according to the present invention. Main constitutional components will be described. As large constitutional components, the electronic control device includes three constitutional components, that is, a metal cover 6, a circuit board 5, and a base 7 that are arranged in a descending order from the top of the drawing.

The circuit board 5 includes: four sets each consisting of a pedestal 16 and a conductive connecting portion 1; four ground lands 2 and four opening portions 3 that correspond to the above-mentioned four sets each consisting of the pedestal 16 and the conductive connecting portion 1; a ground pattern 4; a plurality of electronic components 8; a microcomputer 8A; a heat conductive agent 8B; a wiring pattern 9; and a transmission connector 132. The microcomputer 8A is the most heat-generating electronic component and hence, the microcomputer 8A is configured to radiate heat to the metal cover 6 through the heat conductive agent 8B. The ground lands 2 are also portions of the ground pattern 4, and are placed at positions where the conductive connecting portions 1 are disposed in a state where each ground land 2 has a predetermined area. The ground lands 2, the ground pattern 4, and a power supply ground line form portions of a ground circuit of the circuit board 5. In the present invention, the opening portion 3 formed in the circuit board 5 is an opening having a structure where a space is formed in a penetrating manner from a front surface to a back surface of the circuit board 5. In the above-mentioned configuration, the opening portion 3 includes not only an opening having a so-called hole shape where a circumference of the opening is surrounded by a board structure in the plane of the circuit board but also an opening having a narrow gap shape that is connected to an outer periphery of the board at an edge of the board.

Four protruding members 12-1 are integrally formed with the base 7 made of a resin. In the above, a resin used for forming the base 7 means a non-conductive resin and is not a resin that contains conductive fillers or the like and exhibits conductivity. It is, of course, possible to use a resin material that is partially conductive provided that such a partially conductive resin material does not affect the manner of operation of the present invention.

When the circuit board 5 is mounted on the base 7 made of a resin, the above-described four protruding members 12-1 can be used as alignment members. Then, the base 7 and the circuit board 5 are bonded to each other by a waterproof adhesive 10-1 thus providing hermetic sealing and waterproof property between the base 7 and the circuit board 5. Further, the transmission connector 132 is bonded to the base 7 by a waterproof adhesive 10-2 having a shape that corresponds to the shape of the transmission connector 132.

Figure 14A:
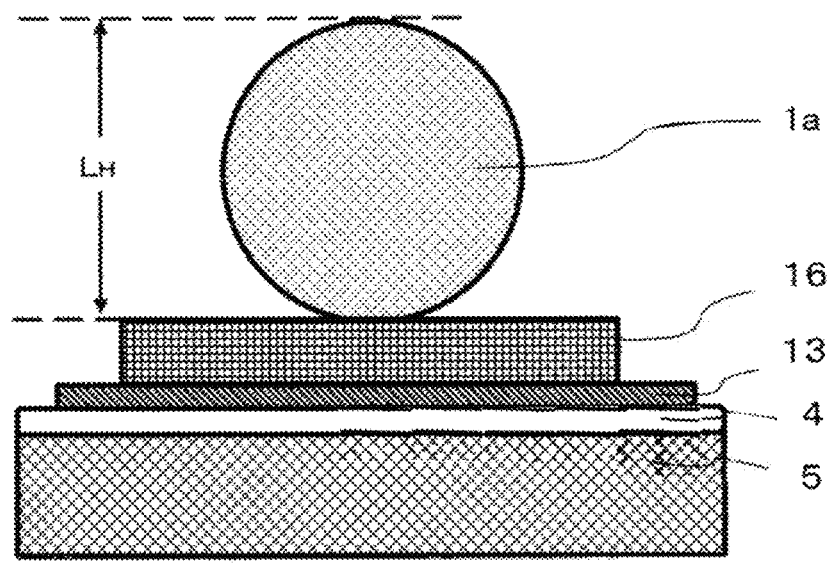
FIG. 14A is a partial side view schematically illustrating a state where a conductive adhesive is dropped in a sixth embodiment.

After mounting of the circuit board 5 on the base 7 is completed, an appropriate amount of a conductive adhesive 1a, that is a material used for forming the conductive connecting portions 1, is dropped on predetermined positions (the positions of the ground lands 2 in the drawing) by a dispenser (see FIG. 14A). An area of the ground land 2 is approximately 40 mm$^2$. At this stage of the operation, the protruding member 12 prevents the conductive adhesive from spreading on the board surface of the circuit board 5 more than necessary.

Figure 14B:
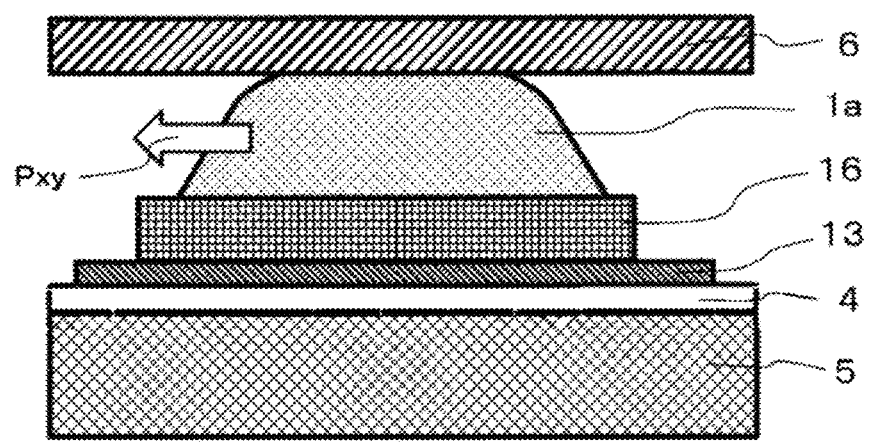
FIG. 14B is a partial schematic side view illustrating a state where the protruding member according to the sixth embodiment is in the midst of being formed.

Thereafter, the metal cover 6 is mounted on the base 7 from above, and a predetermined pressure is applied to the metal cover 6 so that the conductive adhesive 1a is pressed and deformed (see FIG. 14B). The metal cover 6 is fastened to the base 7 at four positions located on the periphery of the base 7. Then, in order to thermally cure the conductive adhesive, the conductive adhesive is held in an atmosphere temperature of 100° C. for approximately 60 minutes. As a result, the conductive adhesive is thermally cured so that the metal cover 6 and the circuit board 5 are electrically conductively connected to each other and are bonded to each other with a predetermined force. The material of the conductive connecting portion 1 used in the present invention exhibits excellent conductivity in a state where a pressure is applied to the conductive connecting portion 1.

EMBODIMENTS

First Embodiment

Figure 1B:
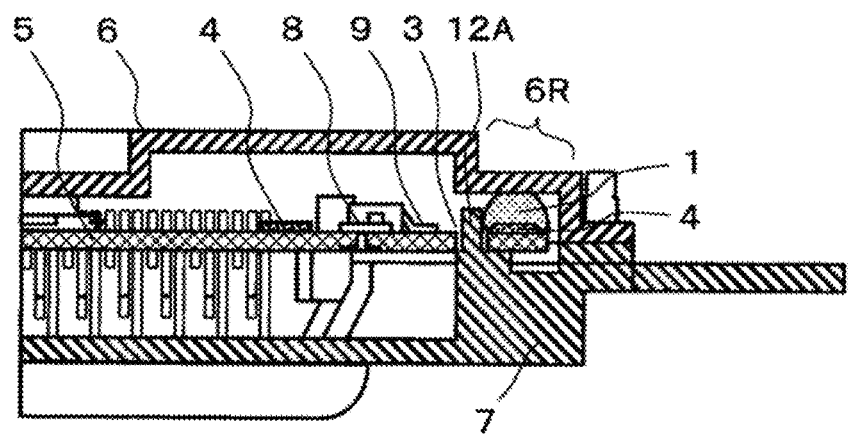
FIG. 1B is a partial cross-sectional view of an electronic control device according to the first embodiment.

FIG. 1A is an external plan view of the electronic control device of the present embodiment, and FIG. 1B is a schematic partial cross-sectional view as viewed from a cross section taken along a line $A_1$-$A_2$ in FIG. 1A. In the present embodiment, the conductive connecting portions 1 are disposed between a recessed portion 6R of the metal cover 6 and the ground pattern 4 of the circuit board 5. The ground pattern 4 is connected to a ground terminal (not illustrated) of the connector portion. The ground pattern 4 is provided exclusively as a countermeasure against an external electromagnetic fault. On the other hand, the ground pattern 4 forms a portion of the ground circuit including a power supply ground line of the electronic circuit.

The recessed portion 6R formed on a portion of the metal cover 6 is provided so as to reduce a size of a gap formed between a back surface of the metal cover 6 and the circuit board 5. The recessed portion 6R presses the conductive connecting portion 1 at the position where the recessed portion R is formed. That is, the conductive connecting portion 1 is disposed immediately below the recessed portion 6R. In such a configuration, the protruding members 12A are disposed between the conductive connecting portions 1 and the electronic components 8 on the circuit board 5, wherein the protruding members 12A are formed integrally and simultaneously with the base 7 made of a resin. The opening portions 3 are formed in the circuit board 5 in advance. The protruding members 12A penetrate the opening portions 3. The protruding members 12A are disposed at an intermediate position where distal ends of the protruding members 12A are not brought into in contact with the back surface of the metal cover 6.

With such a configuration, it is possible to prevent a short-circuit failure caused by contacting of the conductive connecting portion 1 with the wiring pattern 9 and the electronic components 8 disposed on the circuit board 5. In the electronic control device 100 of the present embodiment, the electronic component 8 and the wiring pattern 9 are firmly electromagnetically shielded by the metal cover 6. The electronic control device 100 according the present embodiment can be directly fixed to a vehicle or the like and hence, the electronic control device 100 can achieve high reliability. It must be noted that a material of the conductive connecting portion 1 is not solid at the time of arranging the conductive material on the circuit board 5, but is a soft adhesive, a grease, a gap filler, or the like that exhibits slight fluidity and amorphous property.

[Comparative Example]

Figure 2:
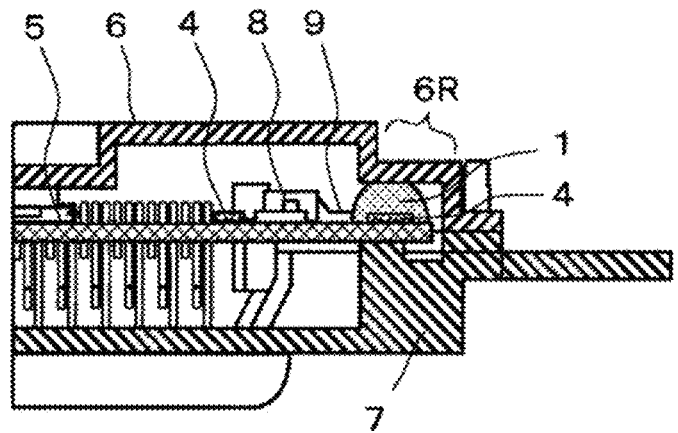
FIG. 2 is a partial cross-sectional view of a comparative example.

FIG. 2 illustrates an external plan view and a schematic partial cross-sectional view of an electronic control device according to a comparative example. Unlike the first embodiment described above, in this comparative example, no protruding member is provided for preventing a conductive connecting portion 1 from being brought into contact with an electronic component 8 mounted on a circuit board 5. Therefore, after a metal cover 6 is mounted on the circuit board 5, a conductive connecting portion 1 is brought into physical contact with the electronic component 8 mounted on the circuit board 5.

A material of the conductive connecting portion 1 is soft before being cured and hence, the material has the property of being easily spread in a lateral direction by pressing. Therefore, when the conductive connecting portion 1 is pressed by the metal cover 6 so that the conductive connecting portion 1 is formed into a predetermined shape, the conductive connecting portion 1 extends beyond a component mounting prohibiting region where mounting of electronic components is prohibited and reaches a component mounting region for circuit components. Therefore, there is a high possibility that an electrical short-circuit failure occurs between the electronic component 8 and a wiring pattern 9 mounted on the circuit board 5.

[Modification 1]

Figure 3A:
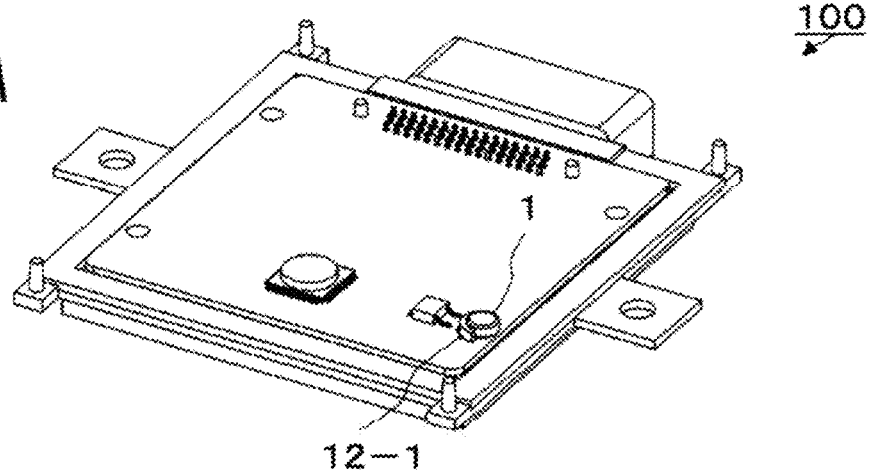
FIG. 3A is a perspective view illustrating a protruding member according to a modification 1 that is formed of a curved surface body having an upper portion that is formed in an arc shape as viewed in a plan view.
Figure 3B:
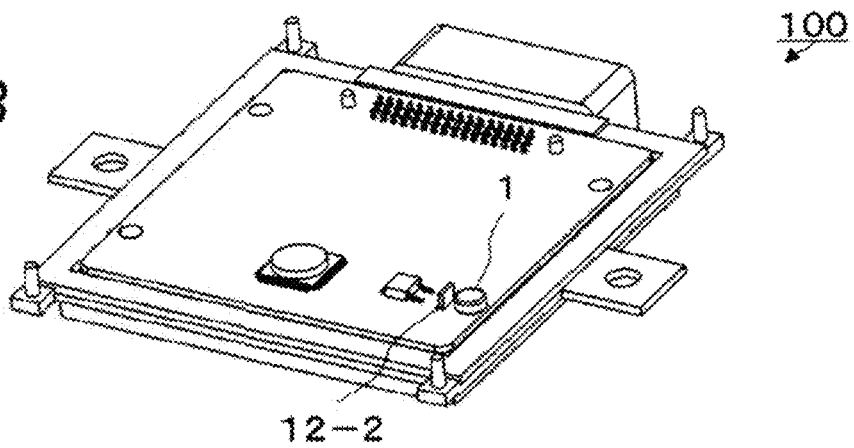
FIG. 3B is a perspective view illustrating a protruding member that is formed of a rectangular parallelepiped body according to the modification 1.
Figure 3C:
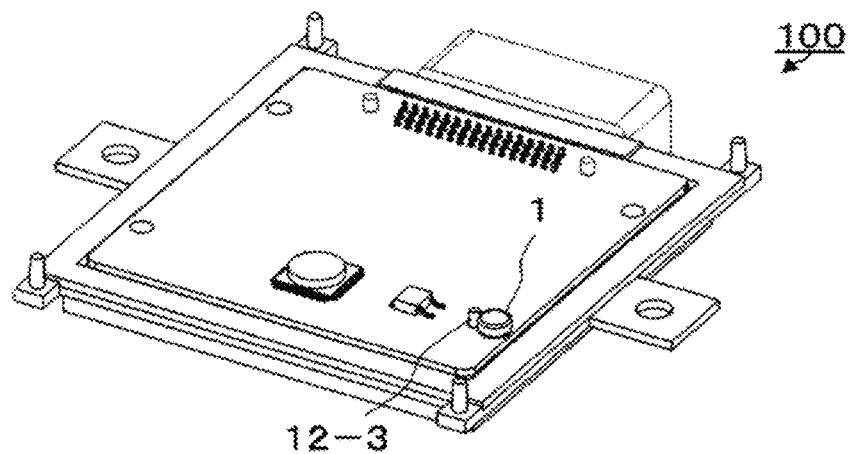
FIG. 3C is a perspective view illustrating a protruding member that is formed of a circular column according to a modification 1.

FIGS. 3A to 3C are perspective views illustrating a modification of the first embodiment. FIG. 3A illustrates a configuration where a shape of a protruding member 12-1 that forms the protruding member as viewed in a plan view in a board surface of a circuit board is an arc shape, FIG. 3B illustrates a configuration where the shape of a protruding member 12-2 that forms the protruding member as viewed in a plan view in a board surface of the circuit board is a rectangular parallelepiped shape, and FIG. 3C illustrates a configuration where the shape of a protruding member 12-3 that forms the protruding member as viewed in a plan view in a board surface the circuit board is a circular columnar shape. In the modification 1, one set formed of one conductive connecting portion 1 and one protruding member 12 is disposed with respect to the entire area of the circuit board.

Figure 4:
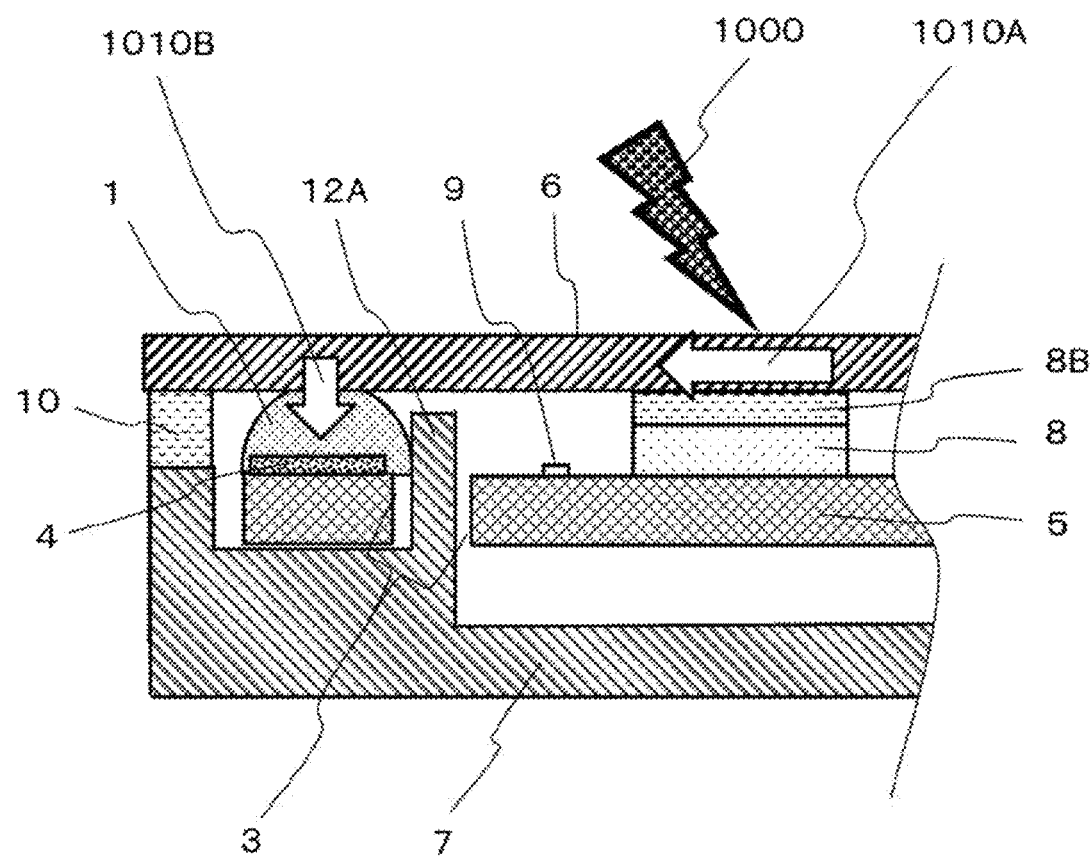
FIG. 4 is an explanatory view of an electromagnetic shield mechanism according to the present invention.

Next, the manner of operation and advantageous effects of the electromagnetic shield according to the present invention will be described with reference to FIG. 4 that is a partial cross-sectional view of the electronic control device. Upper portions of the plurality of electronic components 8, the wiring pattern 9, and the like mounted on the circuit board 5 illustrated in FIG. 4 are covered by the metal cover 6. A high-voltage electric surge 1000 such as static electricity reaches the electronic control device from the outside. In this case, an external current 1010A caused by the high-voltage electric surge forms an internal current 1010B that is transmitted through the metal cover 6 and passes through the conductive connecting portion 1, and is released to the ground pattern 4 of the circuit board 5. The ground pattern 4 forms a portion of the ground circuit. By arranging the conductive connecting portion 1 around the board surface of the circuit board 5, it is possible to form a discharge path through which an electric surge can be rapidly discharged. This prevents the electric surge 1000 from directly hitting the electronic component 8 or the like of the circuit board 5. Therefore, the circuit board 5 can be safely protected from an external electromagnetic interference. Further, as illustrated in FIG. 4, heat generated by the electronic component 8 is thermally transferred to the metal cover 6 through a heat conductive agent 8B, and is radiated from the metal cover 6.

Second Embodiment

Figure 5A:
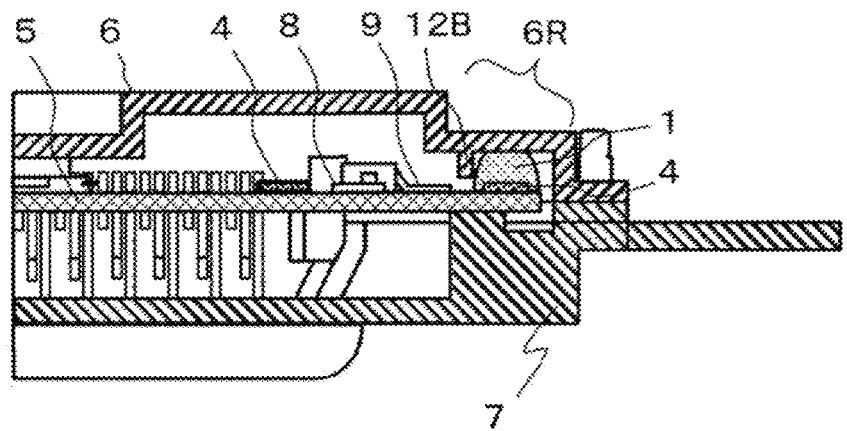
FIG. 5A is a partial cross-sectional view of an electronic control device according to a second embodiment in a mode where a distal end of a protruding member is placed approximately at an intermediate position in an upward direction of a board surface.
Figure 5B:
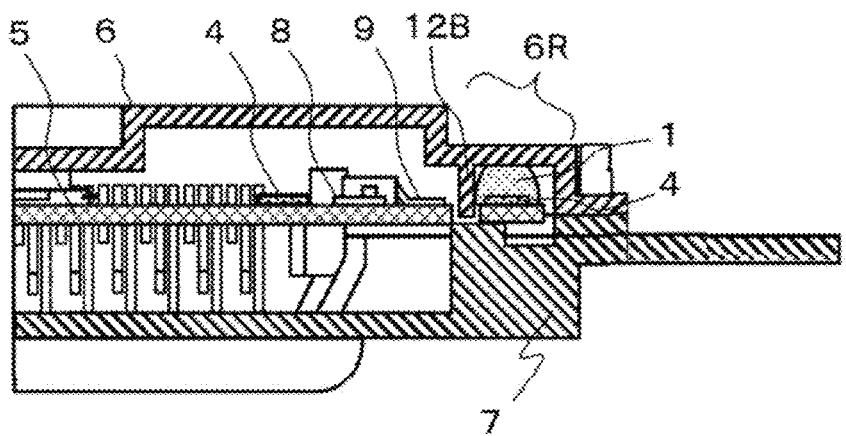
FIG. 5B is a partial cross-sectional view of the electronic control device according to the second embodiment in a mode where a distal end of a protruding member is placed approximately at an intermediate portion of an opening portion.
Figure 5C:
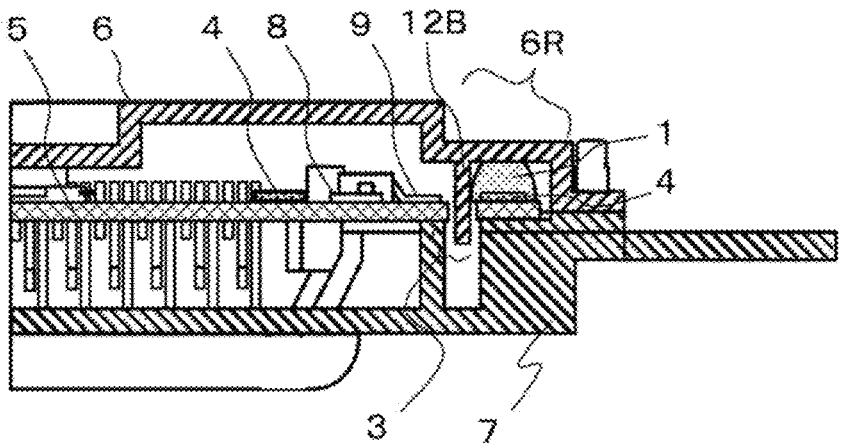
FIG. 5C is a partial cross-sectional view of the electronic control device according to the second embodiment in a mode where a protruding member of the second embodiment passes through an opening portion.
Figure 5D:
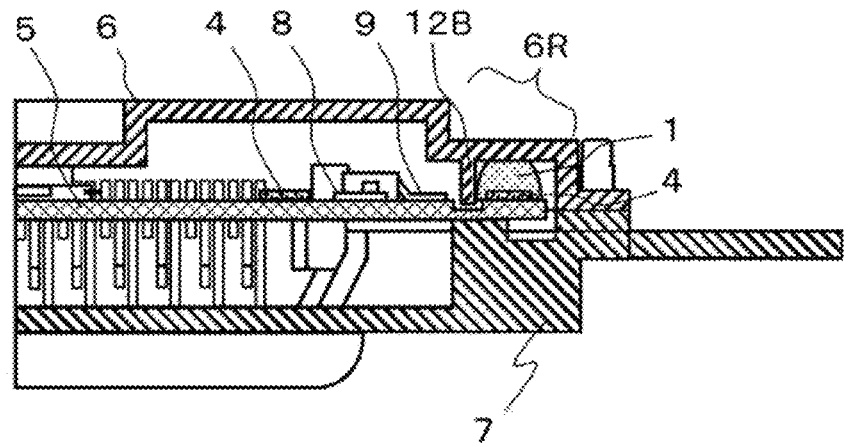
FIG. 5D is a partial cross-sectional view of the electronic control device according to the second embodiment in a mode where a distal end of a protruding member is placed in a groove formed in the circuit board.

FIG. 5A to FIG. 5D illustrate partial cross-sectional views of the present embodiment. The second embodiment differs from the first embodiment with respect to a point that a protruding member 12 is formed as a portion of a metal cover 6. In FIG. 5A, a protruding member 12B made of metal does not reach the position of a front surface of a circuit board 5. In FIG. 5B, a protruding member 12B is inserted into an opening portion 3 formed in the circuit board 5 and reaches the position located in the middle of the board. That is, the protruding member that forms a portion of a metal cover is inserted into the opening portion from a front surface toward a back surface of the circuit board, and a distal end of the protruding member is disposed between the front surface and a base. FIG. 5C illustrates the configuration where the protruding member 12B passes through the opening portion 3, and a distal end of the protruding member 12B is positioned below a back surface of the circuit board 5. FIG. 5D illustrates a configuration where a protruding member enters a groove formed in the circuit board 5. In the configurations illustrated in FIG. 5B and FIG. 5D, the distal end of the protruding member 12B does not penetrate the circuit board 5. That is, the protruding member 12B is inserted into the opening portion or the groove portion from the front surface of the circuit board 5, and the distal end of the protruding member 12B is disposed between the front surface and the back surface of the circuit board 5.

Other constitutional components are the same as the corresponding constitutional components of the first embodiment. Just below a recessed portion 6R of the metal cover 6, a conductive connecting portion 1 that electrically connects a ground pattern 4 of the circuit board 5 and the metal cover 6 is disposed. In this embodiment, between the conductive connecting portion 1 and an electronic component 8 mounted on the circuit board 5, a protruding member 12B that is integrally formed with the metal cover 6 is disposed from an upper side of the circuit board 5.

Also with this configuration, it is possible to prevent spreading of a conductive connecting portion 1 in a board surface direction. In the same manner as the first embodiment, it is possible to prevent a short-circuit failure between the circuit component of the circuit board 5 and the conductive connecting portion 1.

Further, in the same manner as the first embodiment, a high-voltage electric surge such as external static electricity flows through the metal cover 6 and the conductive connecting portion 1 and reaches a ground circuit of the circuit board 5. In this embodiment, the protruding member 12B is made of metal and is positioned near the circuit board 5. However, a resistance value of the conductive connecting portion 1 is overwhelmingly low and hence, a good electromagnetic shielding effect can be obtained also in this embodiment.

Third Embodiment

Figure 6A:
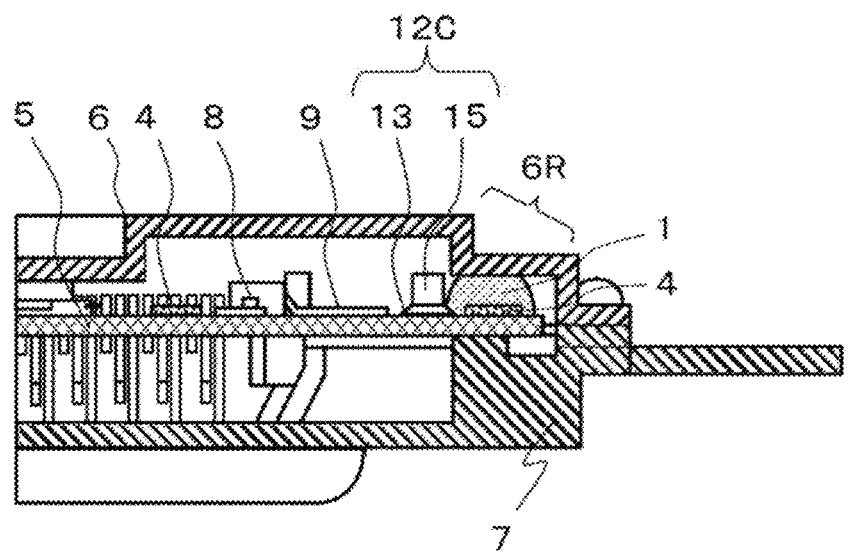
FIG. 6A is a partial cross-sectional view of an electronic control device according to a third embodiment in a mode where a solder and a fixed component are combined to each other.
Figure 6B:
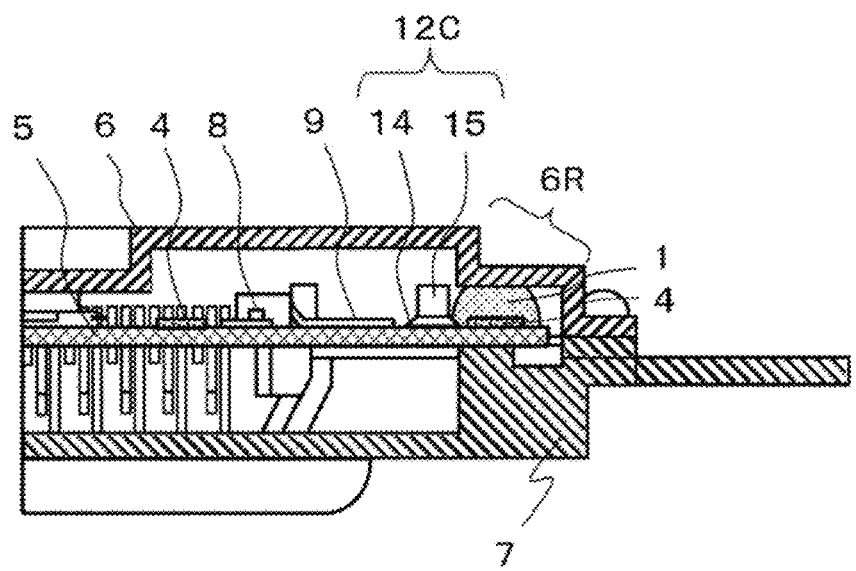
FIG. 6B is a partial cross-sectional view of an electronic control device according to the third embodiment in a mode where an adhesive and a fixed component are combined to each other.

FIG. 6A and FIG. 6B illustrate partial cross-sectional views of the third embodiment. In this embodiment, the spreading of a conductive connecting portion 1 can be suppressed using a fixed component 15 that is mounted on a circuit board 5. The fixed component 15 is fixed to the circuit board 5 by a solder 13, or the fixed component 15 is fixed to the circuit board 5 by an adhesive 14. A protruding member 12C is formed by combining the solder 13 and the fixed component 15 to each other, or by combining the adhesive 14 and the fixed component 15 to each other.

In the present embodiment, it is unnecessary to form an opening portion in the circuit board 5. Further, it is sufficient to arrange and fix the fixed component 15 such as a dummy chip at a predetermined position in a mounting step of the circuit board 5. Accordingly, the manufacturing steps become extremely simple. Also in this embodiment, the contact between an electronic component 8 or a wiring pattern 9 with the conductive connecting portion 1 can be suppressed. As described above, in the same manner as the protruding members 12 formed as portions of a metal cover 6 or a base 7, a plurality of fixed components can be arranged in parallel in a plane with respect to the conductive connecting portions 1 so that the plurality of fixed components can take a balanced arrangement mode as a whole.

It must be noted that, in addition to the case where the fixed component 15 is a complete dummy component having no function as an electronic circuit at all, a normal chip capacitor, a chip resistor, chip diode, or the like can be used as the fixed component 15 by electrically separating such a component from a peripheral electronic circuit.

Fourth Embodiment

Figure 7A:
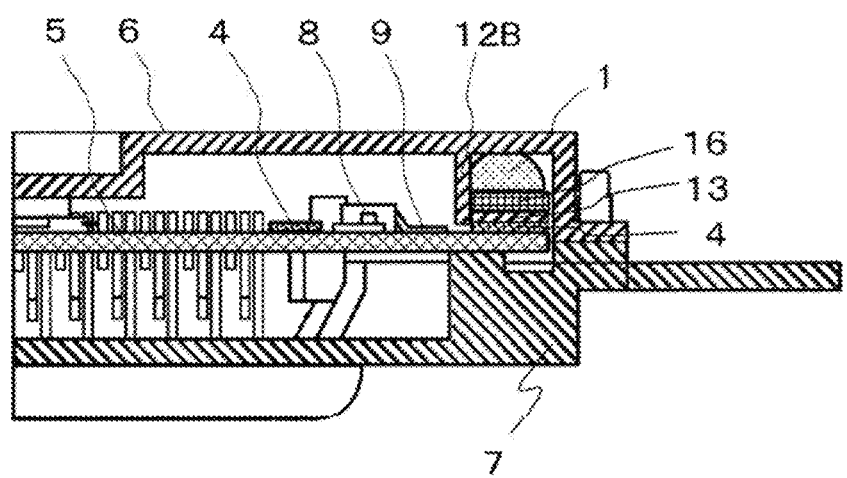
FIG. 7A is a partial cross-sectional view of an electronic control device according to a fourth embodiment in a mode where a conductive connecting member is supported by a solder and a pedestal.
Figure 7B:
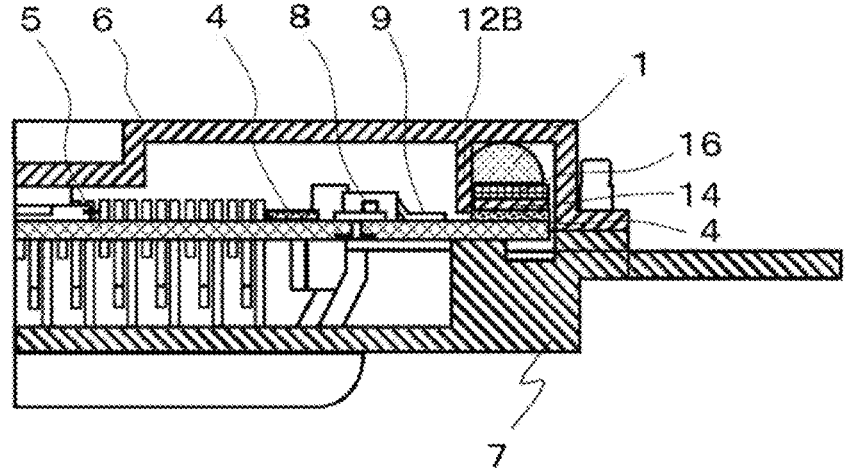
FIG. 7B is a partial cross-sectional view of the electronic control device according to the fourth embodiment in a mode where a conductive connecting member is supported by the adhesive and the pedestal.

FIG. 7A and FIG. 7B illustrate partial cross-sectional views. In this embodiment, no recessed portion is formed in a metal cover 6. Instead, a thick pedestal 16 is mounted on a circuit board 5 in advance, and a conductive connecting portion 1 is disposed on the pedestal 16. The pedestal 16 has a thickness of approximately 1 mm. The thickness of the pedestal 16 can be increased in relation to the structures and the sizes of other members.

In FIG. 7A, the pedestal 16 is fixed by a solder 13. In FIG. 7B, the pedestal 16 is fixed by an adhesive 14. In this embodiment, it is unnecessary to form a recessed portion in the metal cover 6, and it is sufficient to mount the pedestal 16 in advance in a mounting step on the circuit board 5 and hence, manufacturing steps can be simplified.

In the configuration of the present embodiment, a protruding member 12B is disposed in such a manner that a portion of the metal cover 6 extends downward from a back surface side of the metal cover 6 toward a front surface of the circuit board 5. In this case, in the same manner as the second embodiment (FIG. 5B and FIG. 5D) described above, with respect to the configuration of the present embodiment (FIG. 7A and FIG. 7B), as a further modification of the structure and arrangement, the protruding member 12B which forms a portion of the metal cover 6 may be arranged such that a distal end of the protruding member 12B bites into a groove portion formed on a surface of the circuit board 5.

Fifth Embodiment

Figure 8A:
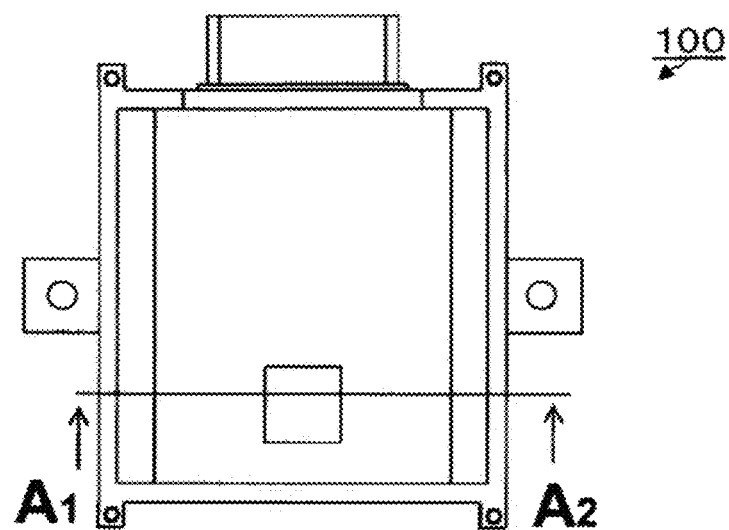
FIG. 8A is an external plan view of an electronic control device according to a fifth embodiment.
Figure 8B:
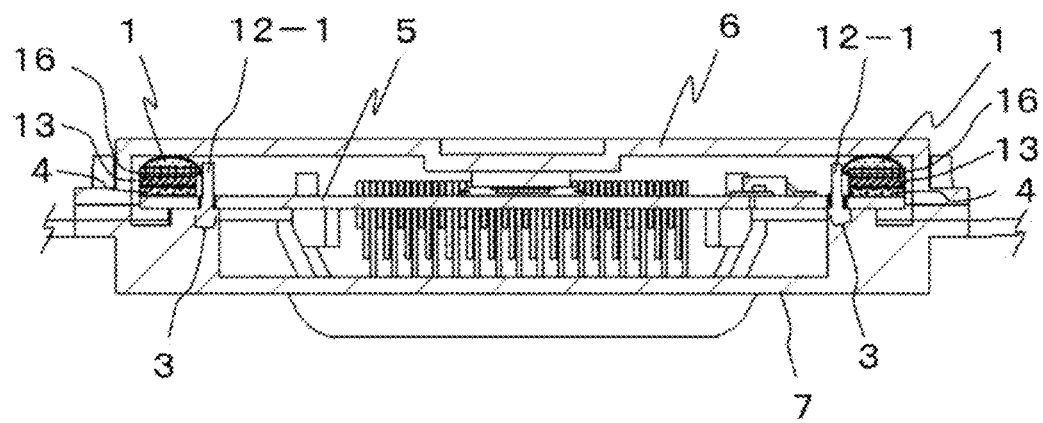
FIG. 8B is a cross-sectional view (cross section taken along $A_1$-$A_2$) of the electronic control device according to the fifth embodiment.
Figure 8C:
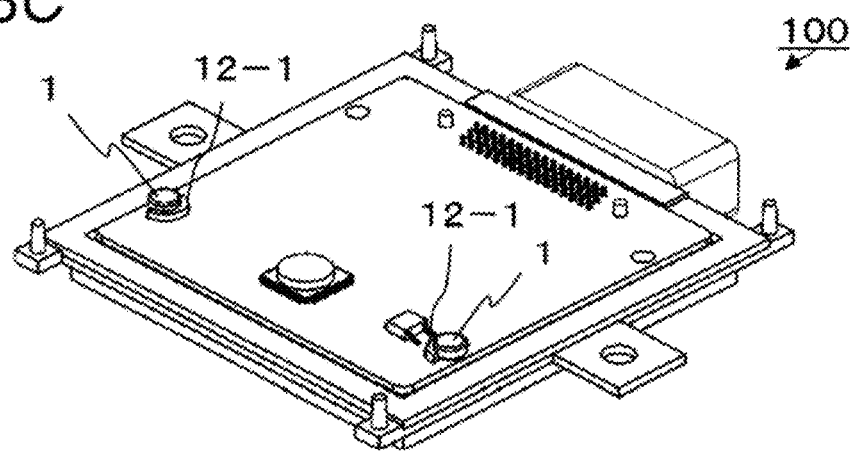
FIG. 8C is a perspective view of the electronic control device according to the fifth embodiment.

FIG. 8A is an external plan view of an electronic control device of the present embodiment, FIG. 8B is a cross-sectional view taken along a line $A_1$-$A_2$ in FIG. 8A, and FIG. 8C is a perspective view of the electronic control device. In this embodiment, opening portions 3 are formed at two left and right positions along one side out of four corners of a circuit board 5. Protruding members 12-1 that are integrally molded with a base 7 are disposed on a board surface in a protruding manner in a state where the protruding members 12-1 pass through the opening portions 3.

Then, conductive connecting portions 1 that electrically connect a ground pattern 4 of the circuit board 5 and a metal cover 6 are disposed. The protruding member 12-1 is formed in an arc shape as viewed in a plan view in the direction of the board surface. The shape of the protruding member 12-1 may be referred to as a shape that follows an outer peripheral shape of a conductive connecting portion 1 having a circular cross section in the direction of the board surface. A portion of a side surface or most of an outer peripheral portion of the conductive connecting portion 1 is brought into contact with the protruding member 12-1.

With such a configuration, it is possible to suppress a short-circuit failure between an electronic component 8 and the like mounted on the circuit board 5 and the conductive connecting portion 1.

In the present embodiment, the conductive connecting portions 1 are disposed at two portions on both outer sides of the circuit board 5 respectively (see FIG. 8B and FIG. 8C). Therefore, the opening portions 3 are formed in the circuit board 5 at positions corresponding the conductive connecting portions 1, and the protruding members 12-1 that are integrally formed with the resin base 7 are made to pass through the opening portions 3. Therefore, the opening portions 3 and the protruding members 12-1 can be used as positioning members when the circuit board 5 is mounted on the base 7. As compared with a case where alignment members are separately provided to the resin base 7 in addition to the protruding members 12-1, an area size of the circuit board 5 can be reduced by an amount corresponding to the addition of the alignment members.

[Component Mounting Region]

Figure 9A:
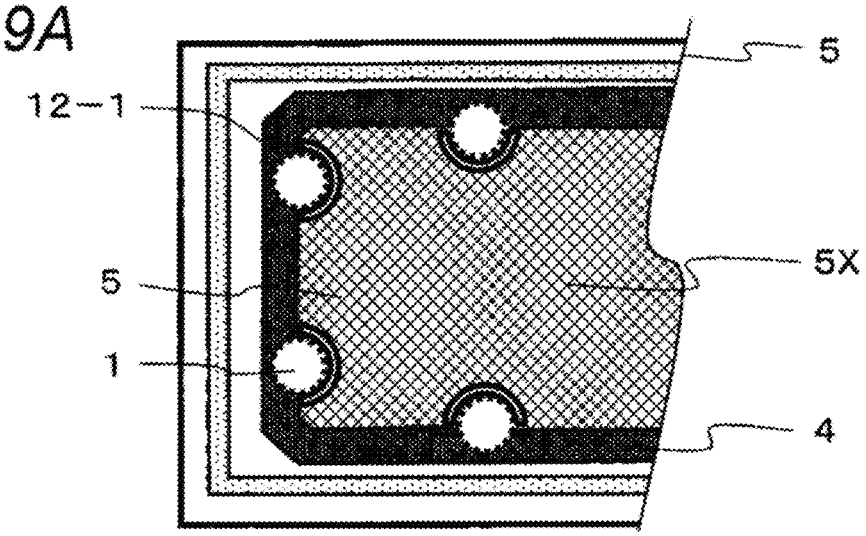
FIG. 9A is a partial plan view of an in-plane layout of a component mounting region and a conductive connecting portion according to the present invention.
Figure 9B:
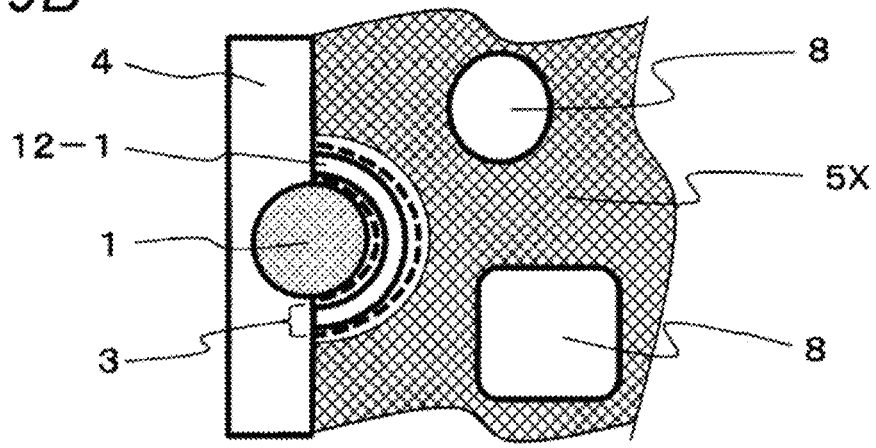
FIG. 9B is a partial plan view of a region in the vicinity of the component mounting region and the conductive connecting portion according to the present invention.

A component mounting region in the present invention will be described with reference to FIG. 9A to FIG. 9D. In the present invention, in order to prevent unnecessary spreading of the conductive connecting portion 1 on the board surface, the protruding member 12-1 is disposed in the vicinity of the conductive connecting portion 1. As a result, it is possible to make an area of a component mounting prohibiting region in which mounting of the electronic components 8 is prohibited relatively narrow. FIG. 9A illustrates a state where four protruding members 12-1 having an arc shape as viewed in a plan view are disposed on the board surface of the circuit board 5. The opening portions 3 are not illustrated. The conductive connecting portion 1 is placed at the position of the ground land (not illustrated in the drawings) that is connected to the ground pattern 4 formed on the board surface. A waterproof adhesive 10 is placed outside the ground pattern 4. A region disposed in the inward direction of the ground pattern 4 forms the component mounting region 5X. A large number of electronic components 8 and wiring patterns (not illustrated in the drawings) are mounted in the component mounting region 5X (see FIG. 13 that is a perspective view).

In a mode illustrated in FIG. 9A, the opening portions 3 that correspond to the protruding members 12-1 are formed in the circuit board 5. The protruding members 12-1 that are integrally formed with the resin base 7 to which the circuit board 5 is mounted pass through the opening portions 3 and appear on the board surface. The conductive connecting portion 1 is formed by curing a conductive adhesive. In a state after the conductive connecting portion 1 is cured, the shape of the conductive connecting portion 1 is formed into a substantially circular shape in a cross-sectional direction parallel to a board surface. Therefore, it is preferable that an outer shape of the protruding member 12-1 form a portion of an arc that follows a surface of the conductive connecting portion 1 having a hemispherical shape. In addition, in order not to make an area of the component mounting region narrow, it is preferable that the size of the protruding member 12-1 be a half cycle or less. In the case of the protruding member 12-1, it is preferable that a center angle of an arc of the protruding member 12-1 be set to 110 to 140 degrees. Further, it is particularly preferable that the angle be set to 120 to 130 degrees in relation to the component mounting region.

Figure 9C:
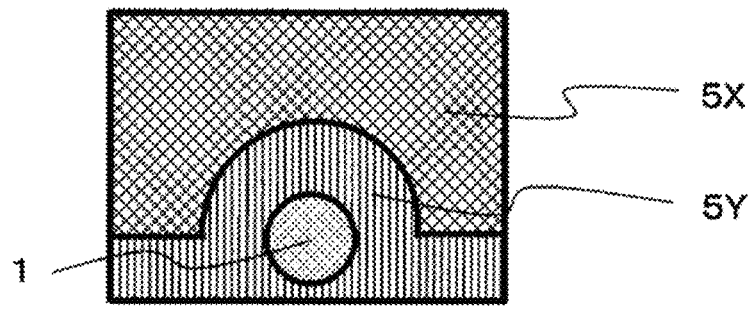
FIG. 9C is a partially enlarged plan view in a case where a component mounting prohibiting region is formed on the component mounting region in the present invention.
Figure 9D:
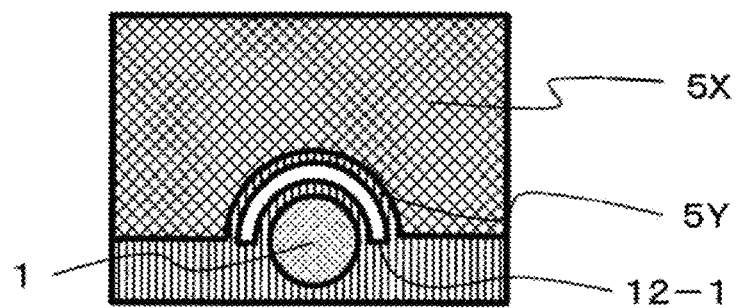
FIG. 9D is a partially enlarged plan view of the conductive connecting portion and the protruding member in the present invention.
Figure 10A:
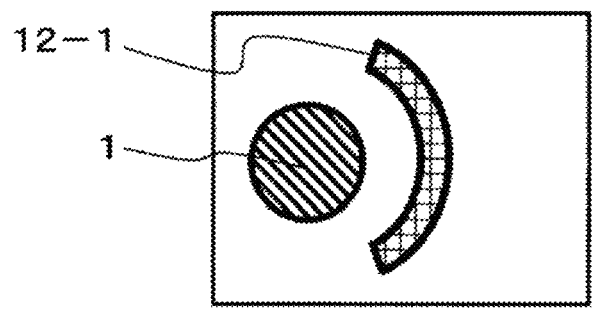
FIG. 10A is a view illustrating a modification of the protruding member of the present invention having an arc shape.
Figure 10B:
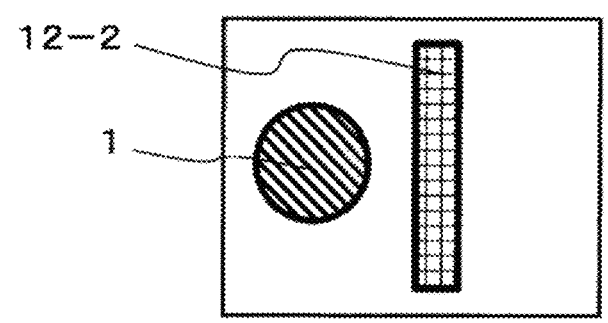
FIG. 10B is a view illustrating a modification of the protruding member of the present invention having a rectangular shape.
Figure 10C:
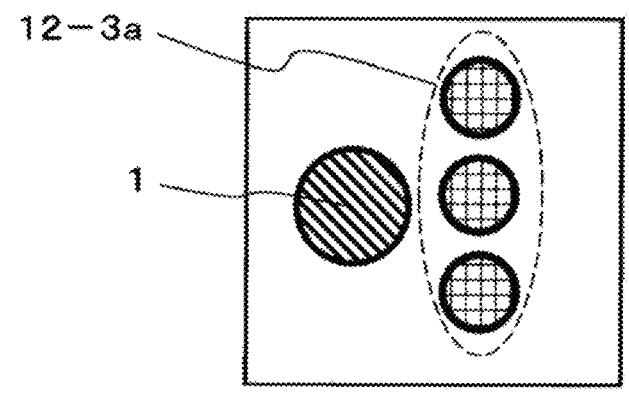
FIG. 10C is a view illustrating a modification of the protruding member of the present invention having three circular shapes (circular columnar shapes).
Figure 10D:
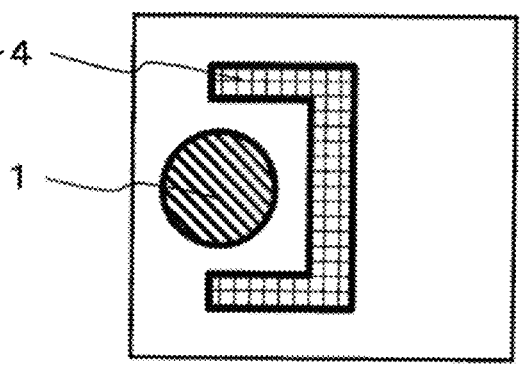
FIG. 10D is a view illustrating a modification of the protruding member of the present invention having a U-shape.

On the other hand, in a case where the protruding member 12-1 is not formed at all in the vicinity of the conductive connecting portion 1, it is necessary to form a large component mounting prohibiting region 5Y in advance by taking into account undesired spreading of a conductive adhesive 1a (see FIG. 9C and FIG. 14B). On the other hand, by forming the protruding member 12-1 according to the present invention that can suppress the spreading of the conductive connecting portion 1, it is possible to set an area of the component mounting prohibiting region 5Y relatively small (see FIG. 9D). For example, the component mounting prohibiting region 5Y of approximately 2 mm is formed outside the protruding member 12-1 according to the present invention. The component mounting prohibiting region 5Y is set by taking into account factors including a positional displacement error of a chip part mounted on the circuit board 5, the positional accuracy of coating of the conductive adhesive 1a in the board surface (see FIG. 14A), assembling accuracy of the base 7 and the circuit board 5 and the like.

For example, in a case where the protruding members 12-1 of the present invention are mounted at four or more places on the circuit board 5, by using the protruding members 12-1 also as the alignment members for the base 7 and the circuit board 5, a mounting area necessary for mounting the alignment members can be reduced at the same time. These space-saving measures have made it possible to reduce the size of the circuit board from approximately 6400 mm$^2$ to approximately 6100 mm$^2$, for example, with respect to a certain product. Alternatively, in a case where the size of the circuit board is maintained at the same size, a component mounting area on the board surface can be increased by approximately 5%.

[Second Modification]

FIG. 10 illustrates a second modification of the protruding member. FIG. 10A illustrates a protruding member 12-1 having an arc shape as viewed in a plan view. FIG. 10B illustrates a protruding member 12-2 having a U-shape as viewed in a plan view. FIG. 10C illustrates a protruding member 12-3a that is a combination of three circular shapes (circular columns) arranged in parallel to each other, and FIG. 10D illustrates a protruding member 12-4 having a U-shape.

Any configurations can be realized also by the method described in the above-mentioned first embodiment where the protruding member is integrally formed with the base 7 or the method described in the second embodiment where the protruding member is integrally formed with the metal cover 6. Among these configurations, the configuration where the protruding member has an arc shape as viewed in a plan view is preferable because the configuration can easily enlarge the component mounting region. In addition, the configuration has a predetermined strength in the X direction as well as in the Y direction in the board surface and hence, the protruding member can be easily handled at the time of assembling a circuit board 5.

[Third Modification]

Figure 11A:
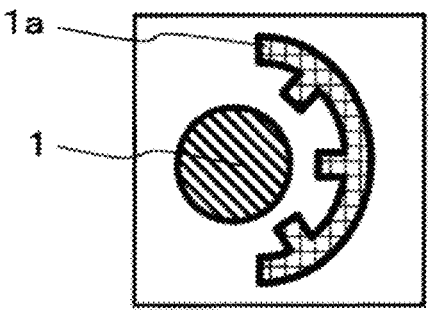
FIG. 11A is a plan view illustrating another modification of the protruding member of the present invention having a rib-attached arc shape.
Figure 11B:
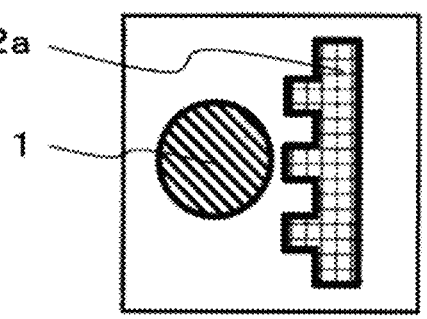
FIG. 11B is a plan view illustrating another modification of the protruding member of the present invention having a rib-attached rectangular shape.
Figure 11C:
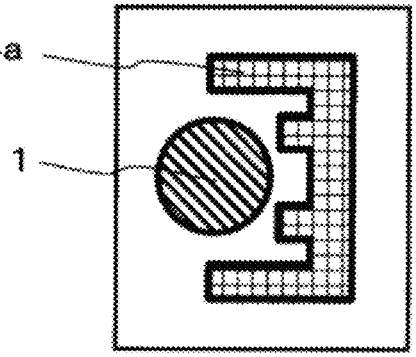
FIG. 11C is a plan view illustrating another modification of the protruding member of the present invention having a rib-attached U-shape.

FIG. 11A to FIG. 11C illustrate a third modification in which ribs are attached to a protruding member 12. FIG. 11A illustrates a protruding member 12-1a having the configuration where the protruding member 12-1a has an arc shape as viewed in a plan view, and three ribs are attached to a conductive connecting portion side of the protruding member 12-1a. FIG. 11B illustrates a protruding member 12-2a having the configuration where the protruding member 12-2a has a rectangular shape as viewed in a plan view, and three ribs are attached to the protruding member 12-2a on an outer side. FIG. 11C illustrates a protruding member 12-4a having the configuration where the protruding member 12-4a has a U-shape as viewed in a plan view, and two ribs are attached to the protruding member 12-4a on an outer side. In the above-described configuration, the term "the outer side" means the direction from the center of the circuit board toward the outside of the board. In this modification, the term "the outer side" means the direction that the conductive connecting portion 1 is arranged.

In any configurations, the protruding member can be formed integrally with a base 7 or a metal cover 6. The configurations according to the present modification are advantageous with respect to the point that the ribs are attached to the protruding member having the thin configuration and hence, the protruding member can exhibit a predetermined strength while reducing its thickness as a whole.

[Fourth Modification]

As the three-dimensional shape of the protruding member 12 in the present invention, besides the above-described configurations, that is, a rectangular parallelepiped body, a curved surface body (having an arc shape in cross section) and a cube, the three-dimensional shape of the protruding member 12 may be selected from a cone, a frustum, and a circular column. The configuration of the protruding member 12 may be selected based on conditions that the protruding member 12 can be easily manufactured, is minimally broken, and can be easily handled during assembling. In the above-described configurations, a distal end side of the protruding member may be tapered.

[Electronic Control Device]

Figure 12:
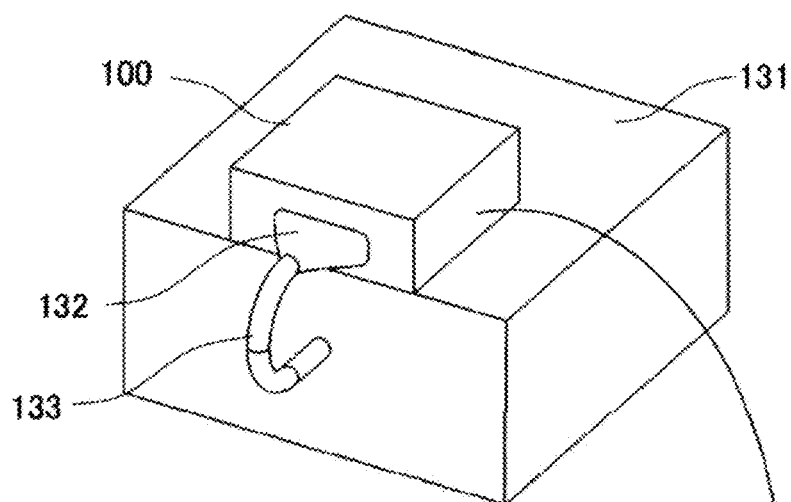
FIG. 12 is a schematic perspective view of a transmission on which an electronic control device is mounted.
Figure 12:
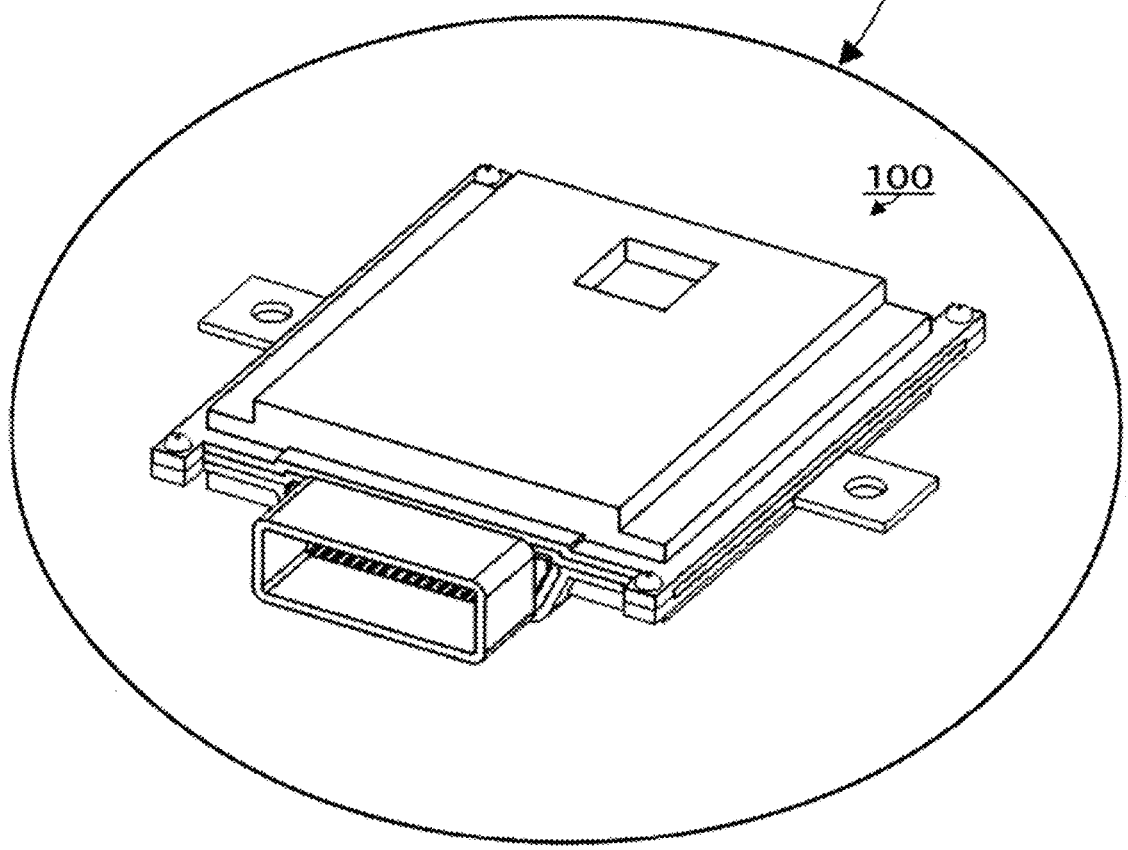

FIG. 12 is a perspective view of an in-vehicle electronic control device to which the present invention is applicable. As described above, by mounting the conductive connecting portions and the protruding members according to the present invention on the circuit board, resistance against an external high voltage surge is improved. In addition, the component mounting region is effectively used by realizing space saving and hence, the overall size of the electronic control device can be reduced as compared with the conventional electronic control device.

FIG. 13 is an exploded perspective view of the electronic control device according to the present invention. In the drawing, one conductive connecting portion 1 is disposed at each of four corners of the component mounting region of the circuit board. As a result, it is possible to effectively prevent the intrusion of external noises into the component mounting region disposed in the electronic control device. The protruding member 12-1 is disposed on four places of the base 7 made of a resin respectively. Further, receiving jigs for receiving the circuit board 5 are disposed outside the protruding members 12-1 disposed at four places. The protruding members 12-1 that are formed integrally with the base 7 made of a resin are inserted into the opening portions 3 formed in the circuit board 5 from a back surface side. Further, the circuit board 5 is sealed by the metal cover 6 on the upper side using the waterproof adhesive 10. With respect to the opening portions 3 formed in the circuit board 5, the entire circuit board 5 is sealed and is separated from the outside and hence, there arises no problem even if the front surface and the back surface of the circuit board 5 are connected to each other through the opening portions 3.

Sixth Embodiment

Figure 14C:
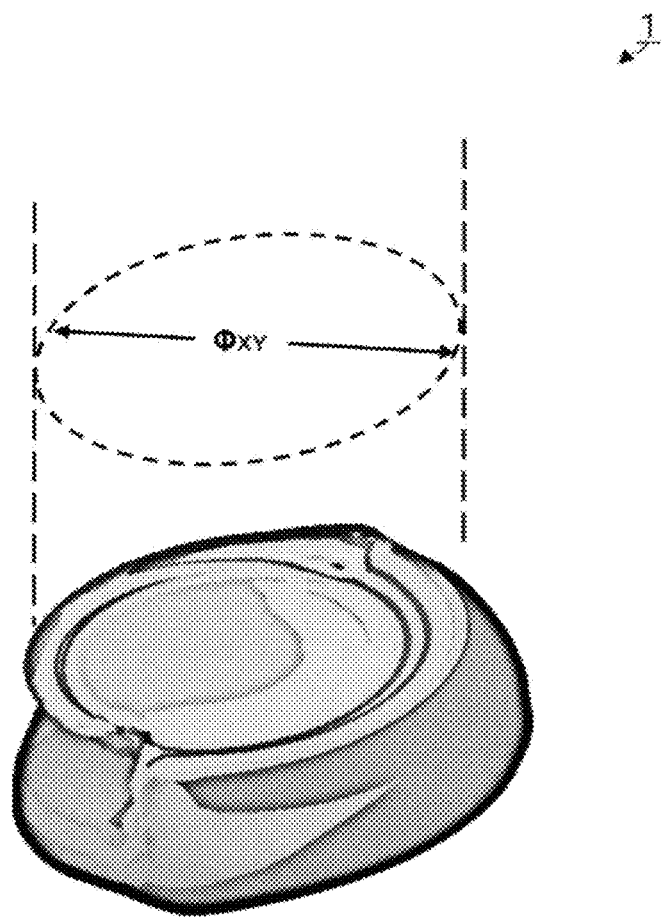
FIG. 14C is a perspective view of a conductive connecting portion 1 according to the sixth embodiment.

Finally, FIG. 14A to FIG. 14C are schematic explanatory views illustrating a method of forming the conductive connecting portion 1. The conductive adhesive 1a has a viscoelastic value of 100 to 400 Pa s at a normal temperature. Approximately 0.5 g of the conductive adhesive 1a is dropped to a predetermined position (the ground land 2 or the like described above) on the board surface of the circuit board 5. The dropped conductive adhesive 1a is formed into a shape almost like a sphere. At this stage of the operation, a droplet height $L_H$ from a surface of the pedestal 16 on the circuit board 5 to an upper surface of the spherical object is approximately 5 mm. The pedestal 16 has a thickness of approximately 1 mm. The control of a droplet height $L_H$ of a spherical object made of the conductive adhesive 1a substantially means the control of a volume and a size of diameter of the spherical object. In this manner, a required amount of the conductive adhesive 1a is accurately dropped to a predetermined position of the circuit board 5 (see FIG. 14A).

In a preferred embodiment, the conductive connecting portions 1 are disposed at one position per 12 to 16 cm² of the circuit mounting area of the circuit board 5. It is more preferable that the conductive connecting portions 1 be disposed at one position per 13 to 14 cm². These numerical values are based on data obtained by simulation, data obtained by an experiment, or data learned empirically.

A main content of the conductive adhesive may be any material provided that the main content exhibits heat resistance and conductivity in a wide temperature range. For example, the conductive adhesive is a silicone-based heat-resistant adhesive. It is preferable that a conductive adhesive contain a carbon-based filler for imparting a conductive function to the conductive adhesive.

The conductive adhesives are arranged in conformity with the size of the board so as to be able to protect the component mounting region in the electronic control device. For example, the conductive adhesives are arranged at two places on both left and right sides of the circuit board 5 and one place at each of four corners of the circuit board 5. Basically, the conductive adhesives are arranged at peripheral positions of the component mounting region. In this manner, an appropriate amount of the conductive adhesive 1a is dropped to all places on the board surface of the circuit board 5 that require the conductive adhesive 1a.

Next, the metal cover 6 is mounted on the circuit board. The metal cover is fastened by bolts or is fixed by fastening jigs. At the predetermined position where the conductive connecting portion 1 is disposed, the size of the gap between the ground contact surface and the metal cover 6 is approximately 5 to 6 mm in the space of the component mounting region. In order to form the conductive connecting portion 1, the size of the gap at the place where the conductive connecting portion 1 is formed is set to a value that falls within a range of 2 to 3 mm by forming the recessed portion 6R or the pedestal 16. When the metal cover 6 is mounted, the conductive adhesive 1a that is dropped to the board surface is pressed by the back surface of the metal cover 6. The conductive adhesive that initially maintains an approximately spherical shape is pressed from above by the metal cover 6 and from below by the pedestal 16 or the like on the circuit board 5. By receiving pressures applied from both sides, a spreading-by-pressing force $P_{XY}$ acts on the conductive adhesive in the board surface direction of the board surface so that the shape of the conductive adhesive approaches a substantially hemispherical shape. It is preferable that the diameter $\Phi_{XY}$ of the conductive adhesive eventually become approximately 8 mm to 12 mm on its contact surface with the metal cover 6. When the size of the gap between the metal cover 6 and the circuit board 5 at the position where the conductive connecting portion 1 is disposed is approximately 2 mm, it is particularly preferable to set the diameter $\Phi_{XY}$ to approximately 10 mm.

In this case, the surface of the conductive adhesive that spreads in the horizontal direction is brought into contact with the protruding member 12 and hence, the spreading of the conductive adhesive in the in-plane direction is substantially suppressed at that position. This is because the conductive adhesive has predetermined viscoelasticity. In this case, with respect to the configuration of the protruding member 12-1, it is preferable that the protruding member 12-1 have an arc shape as viewed in a plan view on the board surface, a length of an upper portion of an arc portion be approximately 13.5 mm, and a center angle of the arc be approximately 130 to 150 degrees. It is preferable that the height of the protruding member 12-1 be approximately 1 to 1.5 mm. The conductive adhesive 1a is pressed from above and below so that the diameter $\Phi_{XY}$ of the conductive adhesive 1a becomes approximately 10 mm or more, and the height of the conductive adhesive 1a becomes approximately 2 mm in a plane where the conductive adhesive 1a is brought into contact with the metal cover 6.

When the protruding members 12B are mounted on the metal cover 6, the protruding members 12B are brought close to the conductive adhesives 1a simultaneously with the mounting of the metal cover 6. When the protruding members 12B that are integrally formed with the metal cover 6 are used, the dropping positions and dropping amounts of the conductive adhesive 1a may be adjusted in advance.

Thereafter, the entire assembled electronic control device is held at a high temperature of approximately 100° C. for approximately 1 hour. By this high-temperature holding step, the conductive adhesive 1a is thermally cured and hence, the conductive connecting portion 1 firmly fixed to the board surface is completed.

The finished conductive connecting portion 1 exhibits favorable conductivity in a wide temperature range of −40° to 120°. In addition, the physical properties of the conductive connecting portion 1 after being cured have a Young's modulus of 3.5 MPa or less in the entire temperature range to be used. To describe the Young's modulus in the respective temperature ranges obtained by dividing the entire temperature range, the Young's modulus in a temperature range of 0 to 120° is approximately 2 MPa, and the Young's modulus in a temperature range of 0° to −40° is approximately 3.5 MPa. The material of the conductive connecting portion 1 used in the present invention exhibits excellent conductivity and adhesiveness in a state where a pressure is applied to the conductive connecting portion 1.

REFERENCE SIGNS LIST 100 electronic control device
1a conductive adhesive
1 conductive connecting portion
2 ground land
3 opening portion
4 ground pattern
5 circuit board
6 metal cover
7 base
8 electronic component
8A microcomputer
8B heat conductive agent
9 wiring pattern
10 waterproof adhesive
12 protruding member
13 solder
14 adhesive
15 fixed component 16 pedestal
130 transmission
131 transmission case
132 transmission connector
133 connecting cable

The invention claimed is:

1. An electronic control device comprising: a base made of a resin; a circuit board on which an electronic component is mounted; a metal cover that covers the electronic component; and a conductive connecting portion that provides an electric conductive connection between the metal cover and a ground circuit of the circuit board, wherein the circuit board is sandwiched between the base and the metal cover, a protruding member is disposed between the conductive connecting portion and the electronic component, and the conductive connecting portion and the protruding member are brought into contact with each other, and wherein an opening portion is formed in a board surface of the circuit board, and the protruding member is a portion of the base, and the protruding member passes through the opening portion, and a distal end of the protruding member is disposed between a surface of the circuit board and the metal cover.

2. The electronic control device according to claim 1, wherein the protruding member is a fixed component that is fixed to the circuit board by a solder or a conductive adhesive.

3. The electronic control device according to claim 1, wherein at least two of the conductive connecting portions are disposed on a front surface of the circuit board.

4. The electronic control device according to claim 1, wherein one conductive connecting portion is disposed per 13 to 14 cm$^2$ of a component mounting region of the circuit board.

5. The electronic control device according to claim 1, wherein a pedestal is disposed between the conductive connecting portion and the circuit board, and the pedestal is electrically connected to the ground circuit.

6. The electronic control device according to claim 1, wherein a material of the conductive connecting portion is selected from a conductive adhesive, grease, and a gap filler.

7. The electronic control device according to claim 1, wherein the conductive connecting portion has a Young's modulus of 4 MPa or less at a normal temperature.

8. The electronic control device according to claim 1, wherein the conductive connecting portion exhibits conductivity in a state where a pressure is applied.

9. The electronic control device according to claim 1, wherein a shape of the protruding member as viewed in a plan view in a board surface direction of the circuit board is selected from an arc shape, a U-shape, and a rectangular shape.

10. The electronic control device according to claim 1, wherein a three-dimensional shape of the protruding member is selected from a rectangular parallelepiped body, a cube, a cone, a frustum, and a circular column.

11. The electronic control device according to claim 1, wherein a receiving jig for mounting the circuit board to the base is disposed around an outer side of a position where the protruding member is placed.

12. An electronic control device comprising: a base made of a resin; a circuit board on which an electronic component is mounted; a metal cover that covers the electronic component; and a conductive connecting portion that provides an electric conductive connection between the metal cover and a ground circuit of the circuit board, wherein the circuit board is sandwiched between the base and the metal cover, a protruding member is disposed between the conductive connecting portion and the electronic component, and the conductive connecting portion and the protruding member are brought into contact with each other and wherein the circuit board includes an opening portion or a groove portion, and the protruding member is a portion of the metal cover, and the protruding member is inserted into the opening portion or the groove portion from a surface of the circuit board, and a distal end of the protruding member is disposed between the front surface and a back surface of the circuit board.

13. An electronic control device comprising: a base made of a resin; a circuit board on which an electronic component is mounted; a metal cover that covers the electronic component; and a conductive connecting portion that provides an electric conductive connection between the metal cover and a ground circuit of the circuit board, wherein the circuit board is sandwiched between the base and the metal cover, a protruding member is disposed between the conductive connecting portion and the electronic component, and the conductive connecting portion and the protruding member are brought into contact with each other, and wherein the circuit board includes an opening portion, and the protruding member is a portion of the metal cover, and the protruding member passes through the opening portion from a front surface toward a back surface of the circuit board, and a distal end of the protruding member is disposed between the back surface and the base.

* * * * *